US010770488B2

(12) United States Patent
Cho (10) Patent No.: US 10,770,488 B2
(45) Date of Patent: Sep. 8, 2020

(54) ACTIVE SWITCH ARRAY SUBSTRATE AND METHOD FOR MANUFACTURING THE SAME

(71) Applicants: HKC Corporation Limited, Shenzhen, Guangdong (CN); Chongqing HKC Optoelectronics Technology Co., Ltd., Chongqing (CN)

(72) Inventor: En-tsung Cho, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/317,045

(22) PCT Filed: Dec. 4, 2017

(86) PCT No.: PCT/CN2017/114369
§ 371 (c)(1),
(2) Date: Jan. 11, 2019

(87) PCT Pub. No.: WO2018/103599
PCT Pub. Date: Jun. 14, 2018

(65) Prior Publication Data
US 2019/0305015 A1    Oct. 3, 2019

(30) Foreign Application Priority Data
Dec. 8, 2016  (CN) .......................... 2016 1 1127220

(51) Int. Cl.
*H01L 27/12* (2006.01)
*G02F 1/1368* (2006.01)
(Continued)

(52) U.S. Cl.
CPC ........ *H01L 27/1296* (2013.01); *G02F 1/1368* (2013.01); *G02F 1/13439* (2013.01);
(Continued)

(58) Field of Classification Search
CPC ............. H01L 27/1296; H01L 27/1222; H01L 27/124; H01L 27/127; H01L 27/1288;
(Continued)

(56) References Cited

U.S. PATENT DOCUMENTS

2009/0072232 A1* 3/2009 Hayashi ............ H01L 21/28202
257/43
2014/0217398 A1* 8/2014 Chang ............... H01L 29/78696
257/43

(Continued)

FOREIGN PATENT DOCUMENTS

| CN | 103227148 A | 7/2013 |
|---|---|---|
| CN | 103489876 A | 1/2014 |
| CN | 103745955 A | 4/2014 |

OTHER PUBLICATIONS

International Search Report of PCT Patent Application No. PCT/CN2017/114369 dated Mar. 1, 2018.

*Primary Examiner* — Christine A Enad (57) ABSTRACT

The present disclosure provides a method for manufacturing an active switch array substrate, and the active switch array substrate, the method includes: providing a substrate; coating a first metal layer on the substrate; forming a gate electrode by treating the first metal layer; depositing an amorphous silicon layer on the substrate and the gate electrode; coating a second metal layer on the amorphous silicon layer; forming a patterned second metal layer; coating a passivation layer on the patterned second metal layer; forming a through hole in the passivation layer; coating a light permeability conductive layer on the passivation layer; and carrying out a fourth photolithography process to the (Continued)

light permeability conductive layer, the passivation layer, and the patterned second metal layer, to form a channel, a source electrode, and a drain electrode on the light permeability conductive layer, the passivation layer, and the patterned second metal layer.

15 Claims, 5 Drawing Sheets

(51) Int. Cl.
| | | |
|---|---|---|
| *G02F 1/1343* | (2006.01) | |
| *G02F 1/1362* | (2006.01) | |
| *H01L 29/417* | (2006.01) | |
| *H01L 29/66* | (2006.01) | |
| *H01L 29/786* | (2006.01) | |
| *H01L 29/10* | (2006.01) | |

(52) U.S. Cl.
CPC ...... *G02F 1/136227* (2013.01); *H01L 27/124* (2013.01); *H01L 27/127* (2013.01); *H01L 27/1222* (2013.01); *H01L 27/1288* (2013.01); *H01L 29/1033* (2013.01); *H01L 29/41733* (2013.01); *H01L 29/66765* (2013.01); *H01L 29/78669* (2013.01)

(58) Field of Classification Search
CPC ........... H01L 29/1033; H01L 29/41733; H01L 29/66765; H01L 29/78669
See application file for complete search history.

(56) References Cited

U.S. PATENT DOCUMENTS

| | | | | |
|---|---|---|---|---|
| 2015/0372021 | A1* | 12/2015 | Yuan | H01L 29/78678 257/72 |
| 2016/0126256 | A1* | 5/2016 | Hwang | G02F 1/134363 257/72 |
| 2016/0172389 | A1* | 6/2016 | Kao | H01L 29/7869 257/66 |
| 2016/0276377 | A1* | 9/2016 | Sun | H01L 27/124 |

* cited by examiner

FIG. 9

ACTIVE SWITCH ARRAY SUBSTRATE AND METHOD FOR MANUFACTURING THE SAME

FIELD

The present disclosure generally relates to the technical field of display, and more particularly relates to an active switch array substrate, and a method for manufacturing the active switch array substrate.

BACKGROUND

The current active switch array substrate includes a source electrode, a drain electrode, and a channel located between the source electrode and the drain electrode. In a traditional process of manufacturing the active switch array substrate, a passivation layer is formed on the channel first, then an indium tin oxide (ITO) film is sputtered on the passivation layer. However, the sputtering process would damage the passivation layer, causing that the damaged passivation layer cannot protect the channel effectively, as a result, the sputtering process may also bring damage to the channel, further resulting in that the thin film transistor has a relatively poor quality.

Further, the passivation layer is also prone to be damaged during a photolithography process for treating the ITO film, namely, the photolithography process may also bring damage to the passivation layer and the channel, which further results in that the thin film transistor has a relatively poor quality.

SUMMARY

A method for manufacturing an active switch array substrate is provides, which can solve the problem of that the active switch array substrate manufactured by the exemplary technique has a relatively poor quality.

The method for manufacturing an active switch array substrate provided by the present disclosure, includes the following steps:

providing a substrate;

coating a first metal layer on the substrate;

forming a gate electrode by treating the first metal layer through a first photolithography process;

depositing an amorphous silicon layer on the substrate and the gate electrode;

coating a second metal layer on the amorphous silicon layer;

forming a patterned second metal layer by treating the second metal layer through a second photolithography process;

coating a passivation layer on the patterned second metal layer;

forming a through hole in the passivation layer by treating the passivation layer through a third photolithography process;

coating a light permeability conductive layer on the passivation layer, the light permeability conductive layer passes through the through hole to contact with the patterned second metal layer; and carrying out a fourth photolithography process to the light permeability conductive layer, the passivation layer, and the patterned second metal layer, to form a channel, a source electrode, and a drain electrode on the light permeability conductive layer, the passivation layer, and the patterned second metal layer, the source electrode and the drain electrode are located at two sides of the channel respectively.

In an exemplary embodiment, the step of forming the channel includes the following steps:

coating a photo-resist film on the light permeability conductive layer;

providing a binary mask which includes two portions having different transmittance;

shielding the photo-resist film using the binary mask;

after ultraviolet light passing through the binary mask, the ultraviolet light irradiating a first portion of the photo-resist film; removing the first portion of the photo-resist film, remaining a second portion of the photo-resist film;

removing the light permeability conductive layer, the passivation layer, and the patterned second metal layer exposed from the second portion of the photo-resist film, forming the channel.

In an exemplary embodiment, a width of the channel is 2 µm to 5 µm.

In an exemplary embodiment, the step of coating the first metal layer on the substrate includes: coating a first metal composite layer on the substrate, the first metal composite layer is a molybdenum-aluminum composite layer, a molybdenum-aluminum alloy composite layer, a titanium-aluminum composite layer, or a copper-molybdenum composite layer.

In an exemplary embodiment, the step of coating the second metal layer on the amorphous silicon layer includes: coating a second metal composite layer on the amorphous silicon layer, the second metal composite layer is a molybdenum-aluminum-molybdenum composite layer, a titanium-aluminum-titanium composite layer, or a copper-molybdenum composite layer.

In an exemplary embodiment, the light permeability conductive layer is a semi-transparent or transparent conductive metal layer.

The present disclosure also provides an active switch array substrate, which includes:

a substrate;

a gate electrode, defined on the substrate;

an amorphous silicon layer, defined on a surface of the substrate and a surface the gate electrode;

a patterned second metal layer, defined on a surface of the amorphous silicon layer;

a passivation layer, defined on a surface of the patterned second metal layer and the surface of the amorphous silicon layer, the passivation layer defines a through hole;

a pixel electrode, formed in the passivation layer, the pixel electrode passes through the through hole to contact with the patterned second metal layer, the patterned second metal layer, the passivation layer, and the pixel electrode cooperatively form a channel through a photolithography process, the channel divides the patterned second metal layer to form a source electrode and a drain electrode.

In an exemplary embodiment, a width of the channel is 2 µm to 5 µm.

In an exemplary embodiment, the gate electrode is a first metal composite layer, the first metal composite layer is a molybdenum-aluminum composite layer, a molybdenum-aluminum alloy composite layer, a titanium-aluminum composite layer, or a copper-molybdenum composite layer.

In an exemplary embodiment, the second metal layer is a second metal composite layer, the second metal composite layer is a molybdenum-aluminum-molybdenum composite layer, a titanium-aluminum-titanium composite layer, or a copper-molybdenum composite layer.

In an exemplary embodiment, the pixel electrode is indium tin oxide.

In an exemplary embodiment, the passivation layer is made of SiNx, a thickness of the passivation layer is 100 μm to 250 μm, x equates to one or three-quarters.

In an exemplary embodiment, the amorphous silicon layer includes a SiNx layer, an α-Si layer, and a N+α-Si layer which are formed on the substrate and the gate electrode in sequence.

In an exemplary embodiment, a data line is formed on the substrate and is interlaced with the gate electrode.

The present disclosure also provides another active switch array switch, which includes:

a substrate;

a gate electrode, defined on the substrate, the gate electrode is a first metal composite layer, the first metal composite layer is a molybdenum-aluminum composite layer, a molybdenum-aluminum alloy composite layer, a titanium-aluminum composite layer, or a copper-molybdenum composite layer;

an amorphous silicon layer, defined on a surface of the substrate and a surface the gate electrode;

a patterned second metal layer, defined on a surface of the amorphous silicon layer, the second metal layer is a second metal composite layer, the second metal composite layer is a molybdenum-aluminum-molybdenum composite layer, a titanium-aluminum-titanium composite layer, or a copper-molybdenum composite layer;

a passivation layer, defined on a surface of the patterned second metal layer and the surface of the amorphous silicon layer, the passivation layer defines a through hole; and a pixel electrode, formed in the passivation layer, the pixel electrode passes through the through hole to contact with the second metal layer, the patterned second metal layer, the passivation layer, and the pixel electrode cooperatively form a channel through a photolithography process, the channel divides the patterned second metal layer to form a source electrode and a drain electrode, a width of the channel is 2 μm to 5 μm.

The light permeability conductive layer, the passivation layer, and the patterned second metal layer of the present disclosure are treated by the fourth photolithography process, for forming the channel, the source electrode, and the drain electrode on the light permeability conductive layer, the passivation layer, and the patterned second metal layer, the source electrode and the drain electrode are located at two sides of the channel respectively. As the channel is not subject to the coating process and the photolithography process, the channel has good quality, for example, the channels have better uniformity, and the active switch array substrate manufactured by the method has better stability.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

The realizing of the aim, functional characteristics, advantages of the present disclosure are further described in detail with reference to the accompanying drawings and the embodiments.

DETAILED DESCRIPTION

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In addition, the descriptions, such as the "first", the "second" in the present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

The present disclosure provides a method for manufacturing an active switch array substrate.

Figure 1:
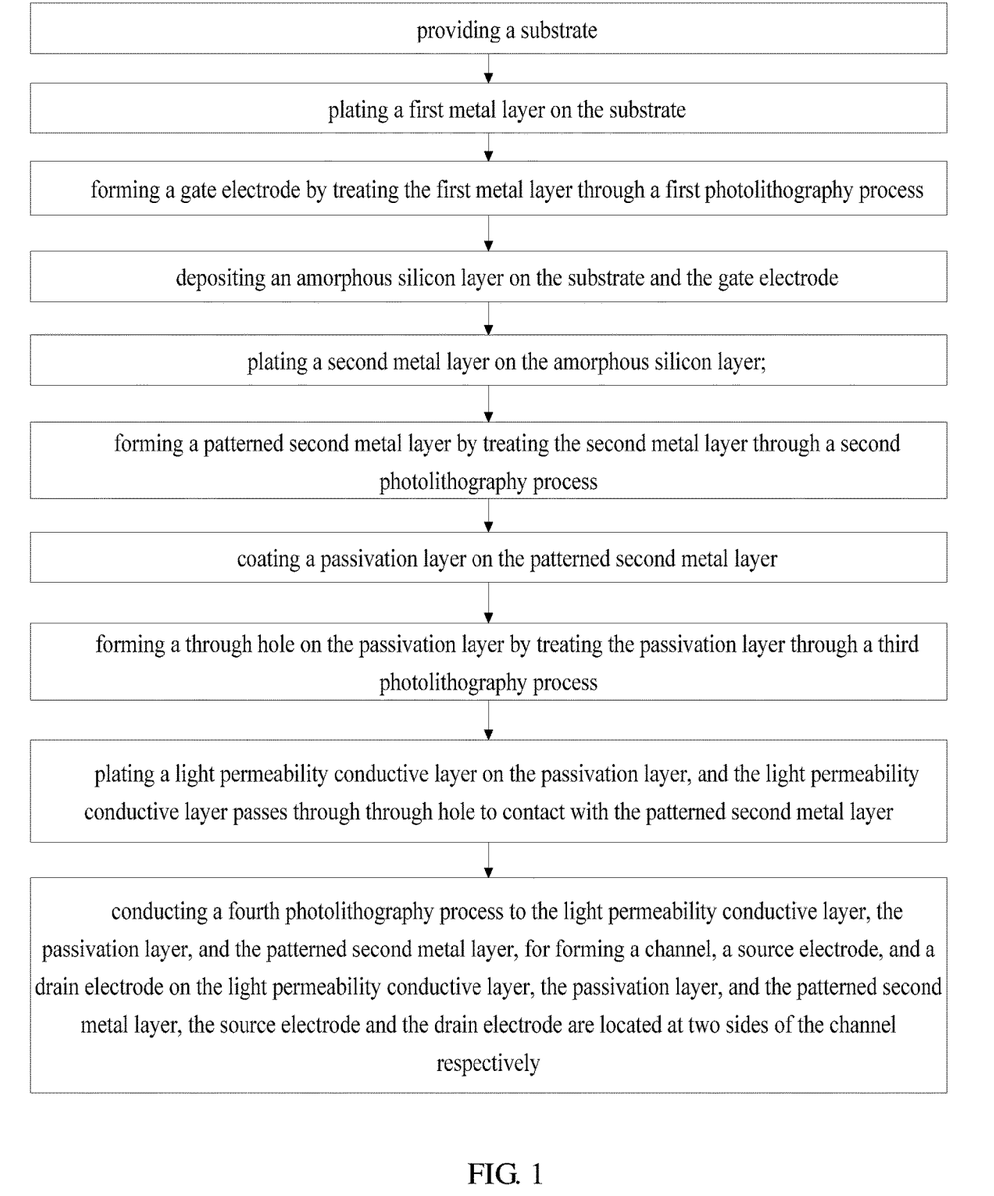
FIG. 1 is a flow chart of the method for manufacturing the active switch array substrate of the present disclosure according to an exemplary embodiment.
Figure 2:
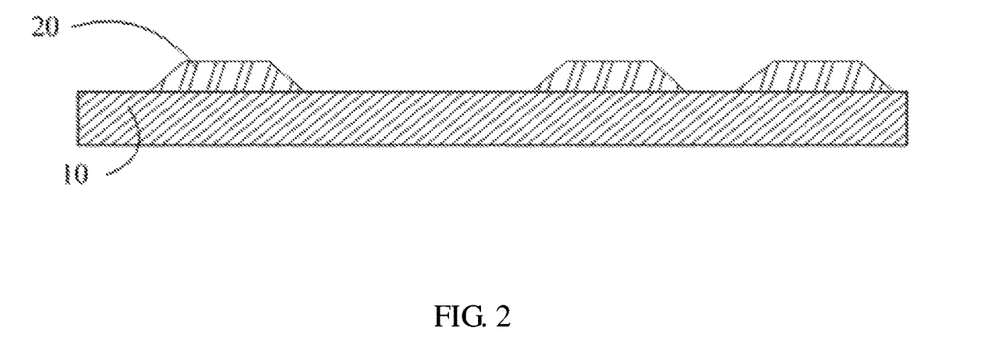
FIG. 2 is a structure diagram of the substrate and the gate electrode formed on the substrate of the active switch array substrate of the present disclosure.
Figure 3:
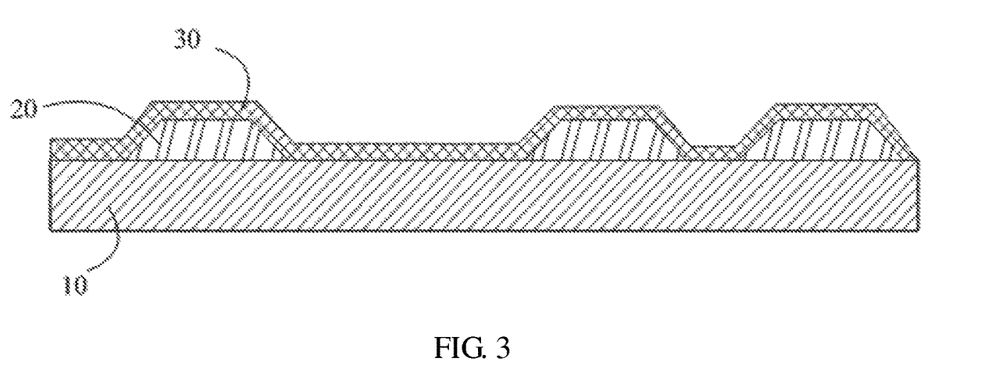
FIG. 3 is a structure diagram of the substrate, the gate electrode and the amorphous silicon layer both formed on the substrate of the active switch array substrate of the present disclosure.
Figure 4:
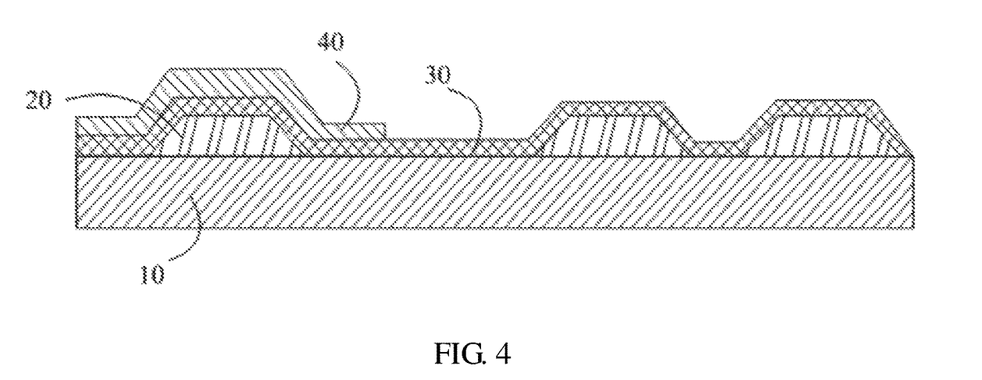
FIG. 4 is a structure diagram of the substrate, the gate electrode, the amorphous silicon layer, and the patterned second metal layer all formed on the substrate of the active switch array substrate of the present disclosure.
Figure 5:
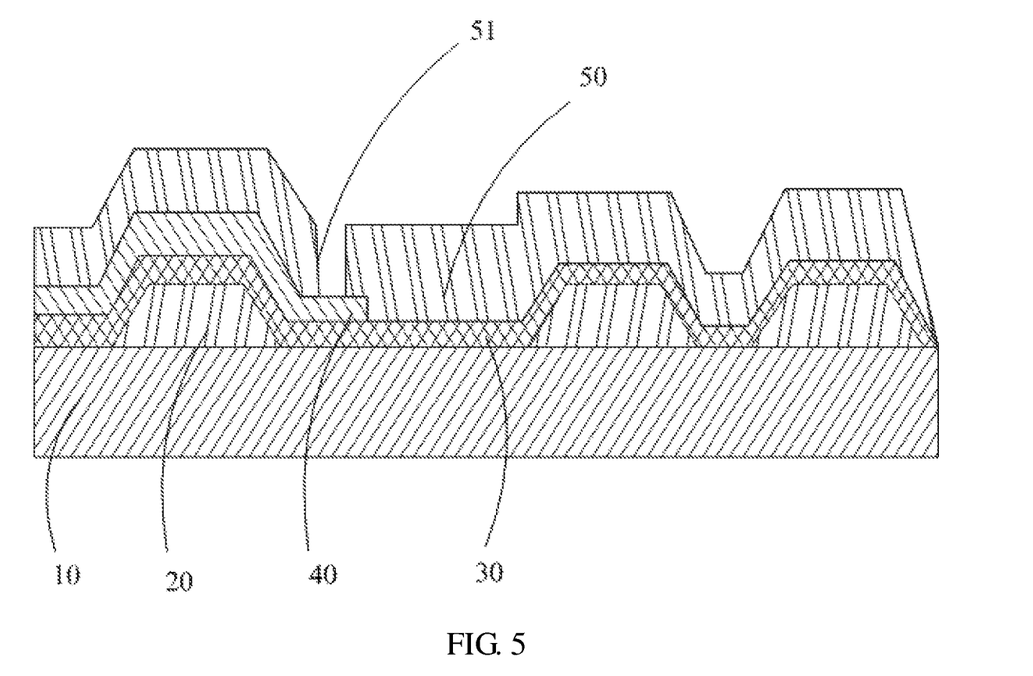
FIG. 5 is a structure diagram of the substrate, the gate electrode, the amorphous silicon layer, the patterned second metal layer, and the passivation layer all formed on the substrate of the active switch array substrate of the present disclosure.
Figure 6:
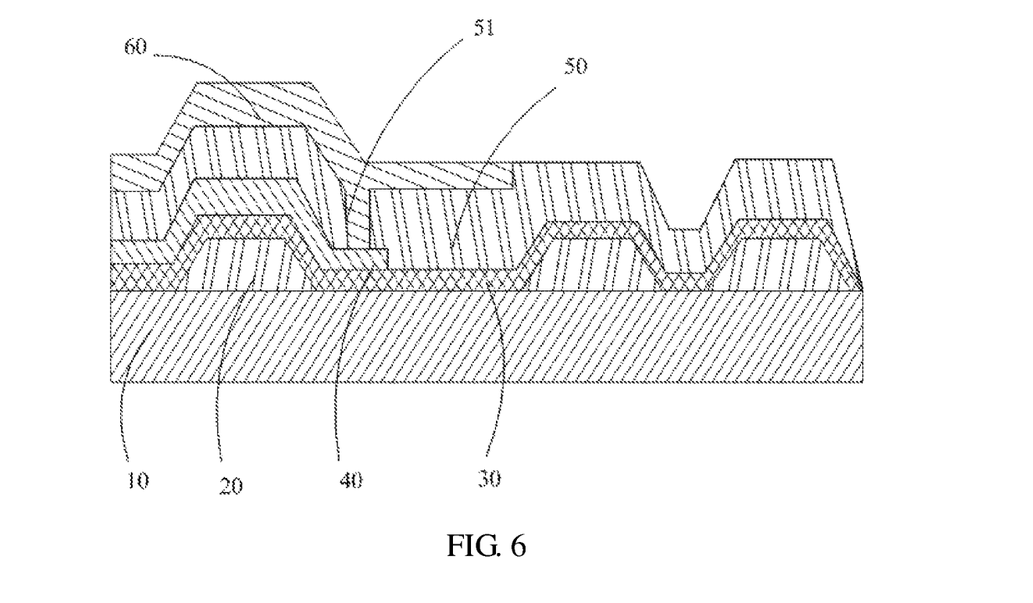
FIG. 6 is a structure diagram of the substrate, the gate electrode, the amorphous silicon layer, the patterned second metal layer, the passivation layer, and the light permeability conductive layer all formed on the substrate of the active switch array substrate of the present disclosure.
Figure 7:
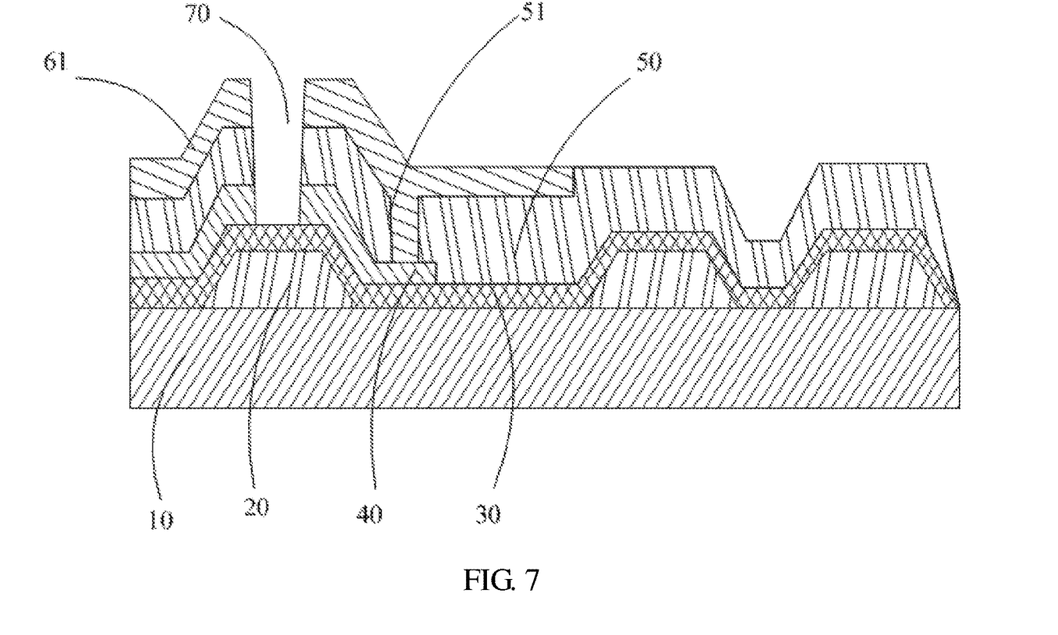
FIG. 7 is a structure diagram of the active switch array substrate of the present disclosure according to an exemplary embodiment.

Referring to FIGS. 1-9, in the exemplary embodiment of the present disclosure, the method for manufacturing the active switch array substrate includes the following steps:

providing a substrate 10;

coating a first metal layer on the substrate 10;

forming a gate electrode by treating the first metal layer through a first photolithography process 20;

depositing an amorphous silicon layer 30 on the substrate 10 and the gate electrode 20;

coating a second metal layer on the amorphous silicon layer 30;

forming a patterned second metal layer by treating the second metal layer through a second photolithography process 40;

coating a passivation layer 50 on the patterned second metal layer 40;

forming a through hole 51 on the passivation layer 50 by treating the passivation layer 50 through a third photolithography process;

coating a light permeability conductive layer 60 on the passivation layer 50, and the light permeability conductive layer 60 passes through the through hole 51 to contract with the patterned second metal layer 40; and carrying out a fourth photolithography process to the light permeability conductive layer 60, the passivation layer 50, and the patterned second metal layer 40, to form a channel 70, a source electrode 41, and a drain electrode 43 on the light permeability conductive layer 60, the passivation layer 50, and the patterned second metal layer 40, the source electrode 41 and the drain electrode 43 are located at two sides of the channel 70 respectively, so as to form the active switch (such as TFT) on the substrate 10.

In an exemplary embodiment, the amorphous silicon layer 30 includes a SiNx layer, an α-Si layer, and a N+α-Si layer which are formed on the substrate 10 and the gate electrode 20 in sequence.

The light permeability conductive layer 60 is a semi-transparent or transparent conductive metal layer. The thickness of the light permeability conductive layer 60 is 0.03 μm to 0.05 μm. The semi-transparent or transparent conductive metal can be indium oxide ($In_2O_3$), stannic oxide ($SnO_2$), zinc oxide (ZnO), cadmium oxide (CdO), Cadmium indium acid ($CdIn_2O_4$), Cadmium Stannate ($Cd_2SnO_4$), zinc stannate ($Zn_2SnO_4$), indium oxide-zinc oxide ($In_2O_3$—ZnO), or indium oxide-Sn ($In_2O_3$:Sn), etc.

The light permeability conductive layer 60, the passivation layer 50, and the patterned second metal layer 40 of the present disclosure are treated by the fourth photolithography process, for forming the channel 70, the source electrode 41, and the drain electrode 43 on the light permeability conductive layer 60, the passivation layer 50, and the patterned second metal layer 40, the source electrode 41 and the drain electrode 43 are located at two sides of the channel 70 respectively. As the channel 70 is not subject to the coating process and the photolithography process, the channel 70 has good quality, for example, the channels 70 have better uniformity, and the active switch array substrate manufactured by the method has better stability, as such the active switch array substrate has better quality.

The step of forming the channel 70 includes the following steps:

coating a photo-resist film on the light permeability conductive layer 60;

providing a binary mask which comprises two portions having different transmittance;

shielding the photo-resist film using the binary mask;

after ultraviolet light passing through the binary mask, the ultraviolet light irradiating a first portion of the photo-resist film; removing the first portion of the photo-resist film, remaining a second portion of the photo-resist film;

removing the light permeability conductive layer 60, the passivation layer 50, and the patterned second metal layer 40 exposed from the second portion of the photo-resist film, forming the channel 70.

It is to be understood that, there is multiple channels 70.

It is to be understood that, the binary mask is composed by a mask portion and a light transmission portion. The mask portion shields a first part of the photo-resist film, the light transmission portion covers the other part of the photo-resist film. Ultraviolet light irradiates the first part of the photo-resist film through the light transmission portion, the second portion of the photo-resist film is not exposed to the ultraviolet light. As the binary mask is composed by the mask portion and the light transmission portion only, the first part and the second part of the photo-resist layer can be clearly defined, as such the light permeability conductive layer 60, the passivation layer 50, and the patterned second metal layer 40 exposed from the second part of the photo-resist film are accuracy removed through an etching method, forming the channel 70. If there is multiple channels 70, the channels 70 are uniform.

A width of the channel 70 is 2 μm to 5 μm.

The width of the channel 70 of the present disclosure is 2 μm to 5 μm. The channel 70 is formed through the fourth photolithography process, and has a better quality.

The step of coating the first metal layer on the substrate 10 includes: coating a first metal composite layer on the substrate 10, the first metal composite layer is a molybdenum-aluminum composite layer, a molybdenum-aluminum alloy composite layer, a titanium-aluminum composite layer, or a copper-molybdenum composite layer.

When the first metal composite layer is the molybdenum-aluminum composite layer, the molybdenum layer is plated on the surface of the substrate 10, the aluminum layer is plated on the molybdenum layer, the thickness of the molybdenum layer is 0.3 μm to 0.5 μm, selectively, the thickness of the molybdenum layer is 0.39 μm, the thickness of the aluminum layer is 0.04 μm to 0.08 μm, selectively, the thickness of the aluminum layer is 0.06 μm.

When the first metal composite layer is the molybdenum-aluminum alloy composite layer, the molybdenum layer is plated on the surface of the substrate 10, the aluminum alloy layer is plated on the molybdenum layer, the thickness of the molybdenum layer is 0.3 μm to 0.5 μm, selectively, the thickness of the molybdenum layer is 0.39 μm, the thickness of the aluminum alloy layer is 0.04 μm to 0.08 μm, selectively, the thickness of the aluminum alloy layer is 0.06 μm.

When the first metal composite layer is the titanium-aluminum composite layer, the titanium layer is plated on the surface of the substrate 10, the aluminum layer is plated on the titanium layer, the thickness of the titanium layer is 0.3 μm to 0.5 μm, selectively, the thickness of the titanium layer is 0.39 μm, the thickness of the aluminum layer is 0.04 μm to 0.08 μm, selectively, the thickness of the aluminum layer is 0.06 μm.

When the first metal composite layer is the copper-molybdenum composite layer, the copper layer is plated on the surface of the substrate 10, the molybdenum layer is plated on the copper layer, the thickness of the copper layer is 0.3 μm to 0.5 μm, selectively, the thickness of the copper layer is 0.39 μm, the thickness of the molybdenum layer is 0.04 μm to 0.08 μm, selectively, the thickness of the molybdenum layer is 0.06 μm.

The first metal layer of the present disclosure is plated on the substrate 10, the first metal layer can be the metal composite layer, as such the first metal layer has better electrical conductivity.

The step of coating the second metal layer on the amorphous silicon layer 30 includes: coating a second metal composite layer on the amorphous silicon layer 30, the second metal composite layer is a molybdenum-aluminum-molybdenum composite layer, a titanium-aluminum-titanium composite layer, or a copper-molybdenum composite layer.

When the second metal composite layer is the molybdenum-aluminum-molybdenum composite layer, the molybdenum layer, the aluminum layer, and another molybdenum layer are plated on the amorphous silicon layer 30 in sequence, the thickness of the molybdenum layer is 0.005 μm to 0.015 μm, selectively, the thickness of the molybdenum layer is 0.01 μm, the thickness of the aluminum layer is 0.2 μm to 0.4 μm, selectively, the thickness of the aluminum layer is 0.3 μm, the thickness of another molybdenum layer is 0.03 μm to 0.04 μm, selectively, the thickness of another molybdenum layer is 0.035 μm.

When the second metal composite layer is the titanium-aluminum-titanium composite layer, the titanium layer, the aluminum layer, and another titanium layer are plated on the amorphous silicon layer 30 in sequence, the thickness of the titanium layer is 0.005 μm to 0.015 μm, selectively, the thickness of the titanium layer is 0.01 μm, the thickness of the aluminum layer is 0.2 μm to 0.4 μm, selectively, the thickness of the aluminum layer is 0.3 μm, the thickness of another titanium layer is 0.03 μm to 0.04 μm, selectively, the thickness of another titanium layer is 0.035 μm.

When the second metal composite layer is the copper-molybdenum composite layer, the copper layer, and the molybdenum layer are plated on the amorphous silicon layer 30 in sequence, the thickness of the copper layer is 0.005 μm to 0.015 μm, selectively, the thickness of the copper layer is 0.01 μm, the thickness of the molybdenum layer is 0.2 μm to 0.4 μm, selectively, the thickness of the molybdenum layer is 0.3 μm.

The second metal layer of the present disclosure is plated on the amorphous silicon layer 30, the second metal layer can be the metal composite layer, as such the second metal layer has better electrical conductivity.

The light permeability conductive layer 60 is a semi-transparent or transparent conductive metal layer. The thickness of the light permeability conductive layer 60 is 0.03 μm to 0.05 μm. The semi-transparent or transparent conductive metal can be indium oxide ($In_2O_3$), stannic oxide ($SnO_2$), zinc oxide (ZnO), cadmium oxide (CdO), Cadmium indium acid ($CdIn_2O_4$), Cadmium Stannate ($Cd_2SnO_4$), zinc stannate ($Zn_2SnO_4$), indium oxide-zinc oxide ($In_2O_3$—ZnO), or indium oxide-Sn ($In_2O_3$:Sn), etc.

The light permeability conductive layer 60 can be the semi-transparent or transparent conductive metal layer, as such the light permeability conductive layer 60 is semi-transparent or transparent, and has better electrical conductivity.

Figure 8:
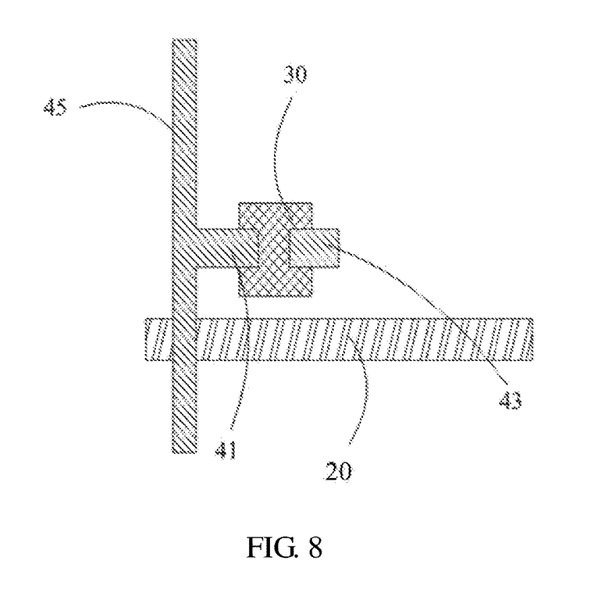
FIG. 8 is a view similar to FIG. 7, while taken from a different aspect.
Figure 9:
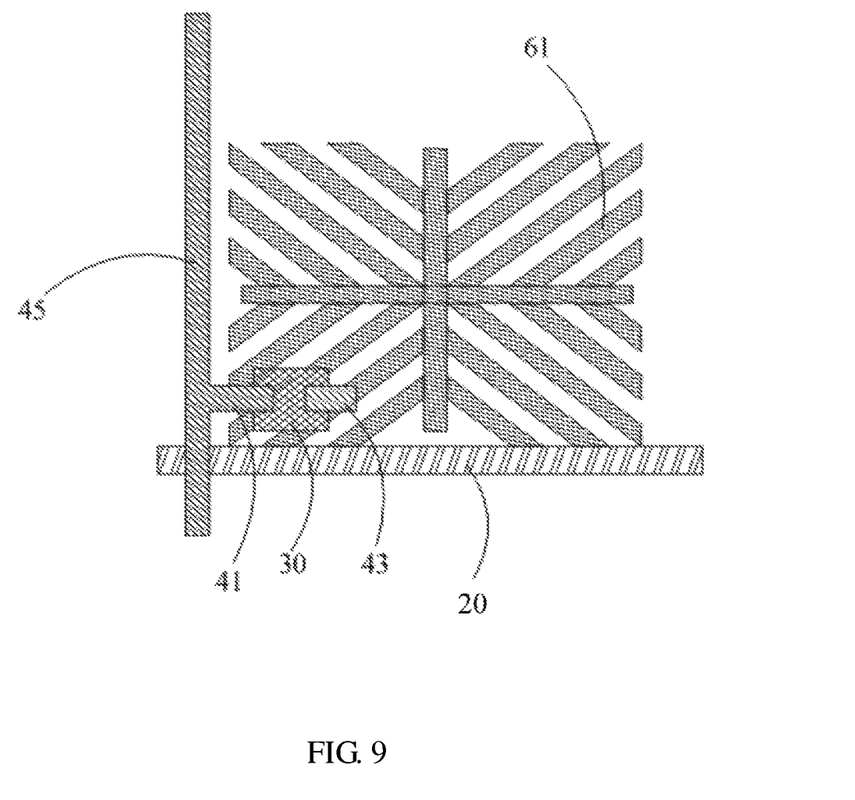
FIG. 9 is a view similar to FIG. 7, while taken from a different aspect.

Referring to FIGS. 7-9, the present disclosure also provides an active switch array substrate manufactured by the method for manufacturing the active switch array substrate, the active switch array substrate includes a substrate 10, a gate electrode 20 defined on the substrate 10, an amorphous silicon layer 30 defined on a surface of the substrate 10 and a surface of the gate electrode 20. The active switch array substrate further includes a patterned second metal layer 40 defined on a surface of the amorphous silicon layer 30, a passivation layer 50 defined on a surface of the patterned second metal layer 40 and the surface of the amorphous silicon layer 30, and a pixel electrode 61 defined in the passivation layer 50. The passivation layer 50 a through hole 51, the pixel electrode 61 passes through the through hole 51 to contact with the patterned second metal layer 40, the patterned second metal layer 40, the passivation layer 50, and the pixel electrode 61 cooperatively form a channel 70 through a photolithography process, the channel 70 divides the patterned second metal layer 40 to form a source electrode 41 and a drain electrode 43.

A data line 45 is formed on the substrate and is interlaced with the gate electrode 10.

The channel 70 of the present disclosure is formed by treating the light permeability conductive layer 60, the passivation layer 50, and the patterned second metal layer 40 by the photolithography process. As the channel 70 is not subject to the coating process and the photolithography process, the channel 70 has good quality, and the active switch array substrate also has better quality.

A width of the channel 70 is 2 μm~5 μm.

The width of the channel 70 of the present disclosure is 2 μm~5 μm, the channel 70 is formed through the fourth photolithography process, and has a better quality.

The gate electrode 20 is the first metal composite layer, the metal composite layer is a molybdenum-aluminum composite layer, a molybdenum-aluminum alloy composite layer, a titanium-aluminum composite layer, copper-molybdenum composite layer.

When the first metal composite layer is the molybdenum-aluminum composite layer, the molybdenum layer is plated on the surface of the substrate 10, the aluminum layer is plated on the molybdenum layer, the thickness of the molybdenum layer is 0.3 μm to 0.5 μm, selectively, the thickness of the molybdenum layer is 0.39 μm, the thickness of the aluminum layer is 0.04 μm to 0.08 μm, selectively, the thickness of the aluminum layer is 0.06 μm.

When the first metal composite layer is the molybdenum-aluminum alloy composite layer, the molybdenum layer is plated on the surface of the substrate 10, the aluminum alloy layer is plated on the molybdenum layer, the thickness of the molybdenum layer is 0.3 μm to 0.5 μm, selectively, the thickness of the molybdenum layer is 0.39 μm, the thickness of the aluminum alloy layer is 0.04 μm to 0.08 μm, selectively, the thickness of the aluminum alloy layer is 0.06 μm.

When the first metal composite layer is the titanium-aluminum composite layer, the titanium layer is plated on the surface of the substrate 10, the aluminum layer is plated on the titanium layer, the thickness of the titanium layer is 0.3 μm to 0.5 μm, selectively, the thickness of the titanium layer is 0.39 μm, the thickness of the aluminum layer is 0.04 μm to 0.08 μm, selectively, the thickness of the aluminum layer is 0.06 μm.

When the first metal composite layer is the copper-molybdenum composite layer, the copper layer is plated on the surface of the substrate 10, the molybdenum layer is plated on the copper layer, the thickness of the copper layer is 0.3 μm to 0.5 μm, selectively, the thickness of the copper layer is 0.39 μm, the thickness of the molybdenum layer is 0.04 μm to 0.08 μm, selectively, the thickness of the molybdenum layer is 0.06 μm.

The first metal layer of the present disclosure is plated on the substrate 10, the first metal layer can be the metal composite layer, as such the first metal layer has better electrical conductivity.

The metal layer plated on the amorphous silicon layer 30 is the second metal composite layer, the second metal composite layer is a molybdenum-aluminum-molybdenum composite layer, a titanium-aluminum-titanium composite layer, or a copper-molybdenum composite layer.

When the second metal composite layer is the molybdenum-aluminum-molybdenum composite layer, the molybdenum layer, the aluminum layer, and another molybdenum layer are plated on the amorphous silicon layer 30 in sequence, the thickness of the molybdenum layer is 0.005 μm to 0.015 μm, selectively, the thickness of the molybdenum layer is 0.01 μm, the thickness of the aluminum layer is 0.2 μm to 0.4 μm, selectively, the thickness of the aluminum layer is 0.3 μm, the thickness of another molybdenum layer is 0.03 μm to 0.04 μm, selectively, the thickness of another molybdenum layer is 0.035 μm.

When the second metal composite layer is the titanium-aluminum-titanium composite layer, the titanium layer, the aluminum layer, and another titanium layer are plated on the amorphous silicon layer 30 in sequence, the thickness of the titanium layer is 0.005 μm to 0.015 μm, selectively, the thickness of the titanium layer is 0.01 μm, the thickness of the aluminum layer is 0.2 μm to 0.4 μm, selectively, the thickness of the aluminum layer is 0.3 μm, the thickness of another titanium layer is 0.03 μm to 0.04 μm, selectively, the thickness of another titanium layer is 0.035 μm.

When the second metal composite layer is the copper-molybdenum composite layer, the copper layer, and the molybdenum layer are plated on the amorphous silicon layer 30 in sequence, the thickness of the copper layer is 0.005 μm to 0.015 μm, selectively, the thickness of the copper layer is 0.01 μm, the thickness of the molybdenum layer is 0.2 μm to 0.4 μm, selectively, the thickness of the molybdenum layer is 0.3 μm.

The second metal layer of the present disclosure is plated on the amorphous silicon layer 30, the second metal layer can be the metal composite layer, as such the second metal layer has better electrical conductivity.

The passivation layer 50 is made of SiNx, a thickness of the passivation layer 50 is 100 μm to 250 μm, x equates to one or three-quarters.

The passivation layer 50 of the present disclosure is SiNx, a thickness of the passivation layer 50 is 100 μm to 250 μm, as such the passivation layer 50 can protect the source electrode 41 and the drain electrode 43.

The present disclosure further provides a display device, which includes a color filter, a liquid crystal, and the active switch array substrate. The liquid crystal is located between the active switch array substrate and the color filter. As the display device adopts all the technical proposal of the above exemplary embodiments, the display device at least has all of the beneficial effects of the technical proposal of the above exemplary embodiments, no need to repeat again.

It is to be understood that, the display device can further includes other components which can be used for carrying out the display function, such as, a horizontal polarizer, a vertical polarizer, etc.

The embodiments above are preferably embodiments of the present disclosure, and the present disclosure is not limited to such embodiments, equivalent structure conversion based on the specification and the drawing of the present disclosure, or directly or indirectly used in other related technical field, both similarly within the protection scope of the present disclosure.

What is claimed is:

1. A method for manufacturing an active switch array substrate, comprising the following steps:
   providing a substrate;
   coating a first metal layer on the substrate;
   forming a gate electrode by treating the first metal layer through a first photolithography process;
   depositing an amorphous silicon layer on the substrate and the gate electrode;
   coating a second metal layer on the amorphous silicon layer;
   forming a patterned second metal layer by treating the second metal layer through a second photolithography process;
   coating a passivation layer on the patterned second metal layer;
   forming a through hole in the passivation layer by treating the passivation layer through a third photolithography process;
   coating a light permeability conductive layer on the passivation layer, the light permeability conductive layer passing through the through hole to contact with the patterned second metal layer; and
   carrying out a fourth photolithography process to the light permeability conductive layer, the passivation layer, and the patterned second metal layer, to form a channel, a source electrode, and a drain electrode on the light permeability conductive layer, the passivation layer, and the patterned second metal layer, the source electrode and the drain electrode being located at two sides of the channel respectively, wherein the channel is separated from the through hole.

2. The method according to claim 1, wherein the step of forming the channel comprises the following steps:
   coating a photo-resist film on the light permeability conductive layer;
   providing a binary mask which comprises two portions having different transmittance;
   shielding the photo-resist film using the binary mask;
   after ultraviolet light passing through the binary mask, the ultraviolet light irradiating a first portion of the photo-resist film; removing the first portion of the photo-resist film, remaining a second portion of the photo-resist film;
   removing the light permeability conductive layer, the passivation layer, and the patterned second metal layer exposed from the second portion of the photo-resist film, forming the channel.

3. The method according to claim 1, wherein a width of the channel is 2 μm to 5 μm.

4. The method according to claim 1, wherein the step of coating the first metal layer on the substrate comprises: coating a first metal composite layer on the substrate, the first metal composite layer being a molybdenum-aluminum composite layer, a molybdenum-aluminum alloy composite layer, a titanium-aluminum composite layer, or a copper-molybdenum composite layer.

5. The method according to claim 4, wherein the step of coating the second metal layer on the amorphous silicon layer comprises: coating a second metal composite layer on the amorphous silicon layer, the second metal composite layer being a molybdenum-aluminum-molybdenum composite layer, a titanium-aluminum-titanium composite layer, or a copper-molybdenum composite layer.

6. The method according to claim 1, wherein the light permeability conductive layer is a semi-transparent or transparent conductive metal layer.

7. An active switch array substrate, comprising:
a substrate;
a gate electrode, defined on the substrate;
an amorphous silicon layer, defined on a surface of the substrate and a surface the gate electrode;
a patterned second metal layer, defined on a surface of the amorphous silicon layer;
a passivation layer, defined on a surface of the patterned second metal layer and the surface of the amorphous silicon layer, the passivation layer defining a through hole; and
a pixel electrode, formed in the passivation layer, the pixel electrode passing through the through hole to contact with the patterned second metal layer, the patterned second metal layer, the passivation layer, and the pixel electrode cooperatively forming a channel through a photolithography process, the channel dividing the patterned second metal layer to form a source electrode and a drain electrode, the channel being separated from the through hole.

8. The active switch array substrate according to claim 7, wherein a width of the channel is 2 μm to 5 μm.

9. The active switch array substrate according to claim 7, wherein the gate electrode is a first metal composite layer, the first metal composite layer is a molybdenum-aluminum composite layer, a molybdenum-aluminum alloy composite layer, a titanium-aluminum composite layer, or a copper-molybdenum composite layer.

10. The active switch array substrate according to claim 7, wherein the second metal layer is a second metal composite layer, the second metal composite layer is a molybdenum-aluminum-molybdenum composite layer, a titanium-aluminum-titanium composite layer, or a copper-molybdenum composite layer.

11. The active switch array substrate according to claim 7, wherein the pixel electrode is indium tin oxide.

12. The active switch array substrate according to claim 7, wherein the passivation layer is made of SiNx, a thickness of the passivation layer is 100 μm to 250 μm, x equates to one or three-quarters.

13. The active switch array substrate according to claim 7, wherein the amorphous silicon layer comprises a SiNx layer, an α-Si layer, and a N+α-Si layer which are formed on the substrate and the gate electrode in sequence.

14. The active switch array substrate according to claim 7, wherein a data line is formed on the substrate and is interlaced with the gate electrode.

15. An active switch array substrate, wherein, the active switch array substrate comprises:
a substrate;
a gate electrode, defined on the substrate, the gate electrode is a first metal composite layer, the first metal composite layer is a molybdenum-aluminum composite layer, a molybdenum-aluminum alloy composite layer, a titanium-aluminum composite layer, or a copper-molybdenum composite layer;
an amorphous silicon layer, defined on a surface of the substrate and a surface the gate electrode;
a patterned second metal layer, defined on a surface of the amorphous silicon layer, the second metal layer is a second metal composite layer, the second metal composite layer is a molybdenum-aluminum-molybdenum composite layer, a titanium-aluminum-titanium composite layer, or a copper-molybdenum composite layer;
a passivation layer, defined on a surface of the patterned second metal layer and the surface of the amorphous silicon layer, the passivation layer defines a through hole; and
a pixel electrode, formed in the passivation layer, the pixel electrode passes through the through hole to contact with the second metal layer, the patterned second metal layer, the passivation layer, and the pixel electrode cooperatively form a channel through a photolithography process, the channel divides the patterned second metal layer to form a source electrode and a drain electrode, a width of the channel is 2 μm to 5 μm, the channel is separated from the through hole.

* * * * *